(12) United States Patent
Lien et al.

(10) Patent No.: US 10,615,820 B2
(45) Date of Patent: Apr. 7, 2020

(54) SYSTEMS AND METHODS FOR DIGITAL EXCESS LOOP DELAY COMPENSATION IN A CONTINUOUS TIME DELTA SIGMA MODULATOR

(71) Applicant: Taiwan Semiconductor Manufacturing Co., Ltd., Hsinchu (TW)

(72) Inventors: Bei-Shing Lien, Taipei (TW); Jaw-Juinn Horng, Hsinchu (TW); Tai-cheng Kee, Hsinchu (TW); Pang-yen Chin, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/175,561

(22) Filed: Oct. 30, 2018

(65) Prior Publication Data

US 2019/0149164 A1 May 16, 2019

Related U.S. Application Data

(60) Provisional application No. 62/585,446, filed on Nov. 13, 2017.

(51) Int. Cl.
*H03M 1/06* (2006.01)
*H03M 3/00* (2006.01)

(52) U.S. Cl.
CPC ............ *H03M 3/37* (2013.01); *H03M 3/338* (2013.01); *H03M 3/494* (2013.01); *H03M 3/424* (2013.01); *H03M 3/464* (2013.01)

(58) Field of Classification Search
CPC ........ H03M 3/37; H03M 3/494; H03M 3/424; H03M 3/464; H03M 3/338
USPC .......................................... 341/143, 155, 118
See application file for complete search history.

(56) References Cited

U.S. PATENT DOCUMENTS

| | | | | |
|---|---|---|---|---|
| 5,225,875 A | * | 7/1993 | Shapiro | G02F 1/13473 345/690 |
| 5,920,273 A | * | 7/1999 | Hirano | H03M 3/384 341/118 |
| 5,942,937 A | * | 8/1999 | Bell | H03K 5/08 327/270 |
| 8,400,340 B2 | * | 3/2013 | Mishra | H03M 3/496 341/118 |
| 9,735,797 B2 | * | 8/2017 | Zhao | H03M 1/1071 |
| 9,838,031 B2 | * | 12/2017 | Dong | H03M 3/322 |
| 2007/0080843 A1 | * | 4/2007 | Lee | H03M 3/462 341/155 |

(Continued)

*Primary Examiner* — Jean B Jeanglaude
(74) *Attorney, Agent, or Firm* — Duane Morris LLP

(57) ABSTRACT

A continuous time delta sigma modulator is described in this application. In one example, the continuous time delta sigma modulator includes: a quantizer, a buffer module, a randomizer, and a reference module. The quantizer includes a comparator that generates a digital output based on a comparison of a reference potential with an input generated based on a sample of an analog signal. The buffer module stores the digital output for a predetermined delay period and outputs the digital output after the predetermined delay period as a delayed digital output. The randomizer randomizes the delayed digital output to generate a randomized digital output. The reference module modifies the reference potential based on the randomized digital output.

20 Claims, 9 Drawing Sheets

(56) References Cited

U.S. PATENT DOCUMENTS

2014/0132431 A1* 5/2014 Steensgaard-Madsen ................... H03M 1/0668
341/131
2016/0020781 A1* 1/2016 Baringer ................ H03M 3/46
341/110

* cited by examiner

SYSTEMS AND METHODS FOR DIGITAL EXCESS LOOP DELAY COMPENSATION IN A CONTINUOUS TIME DELTA SIGMA MODULATOR

CROSS-REFERENCE TO RELATED APPLICATION

The present application claims priority to U.S. Provisional Patent Application No. 62/585,446, filed on Nov. 13, 2017, which is incorporated by reference herein in its entirety

BACKGROUND

Analog-to-digital converters (ADCs) convert samples of an analog input signal into digital values corresponding to the samples. ADCs may be used in various electronic devices, such as finite impulse resolution (FIR) digital to analog converters (DACs) and many other types of electronic devices. A digital-to-analog converter (DAC) is a device for converting a digital signal to an analog signal.

A delta sigma (or sigma delta) modulation is a method for encoding analog signals into digital signals as found in an ADC. It can also be used to transfer high bit-count low frequency digital signals into lower bit-count higher frequency digital signals as part of a DAC.

A quantizer of a delta sigma modulator generates a digital representation of an input generated based on a sample of an analog signal via a conversion process. One or more DACs can convert the digital outputs to corresponding analog values, and the input to the quantizer is updated based on the analog values.

Continuous time delta sigma modulators generally suffer from excess loop delay (ELD). The ELD of a delta sigma modulator may correspond to a delay period associated with the one or more DACs, a delay period of the components that provide the input to the quantizer, and a delay period of the quantizer itself. The delay period of the quantizer may correspond to a period between when the quantizer is prompted to update the digital outputs and when the quantizer actually outputs the updated digital outputs.

A conventional method for compensating ELD of a delta sigma modulator includes providing an additional DAC and one or more delay buffers. However, this conventional method requires at least two DACs, which increases power consumption of the delta sigma modulator.

In addition, DACs tend to generate errors correlated to the digital input. These errors are typically the result of component mismatches, process and thermal gradients, and other non-linear error sources. These errors may create harmonic distortion that causes undesirable effects to the conversion process. Dynamic element matching (DEM) may be used to compensate for components mismatch and improve the average linearity of a DAC. For example, the one's in a given thermometer code are spread around in a random fashion by DEM so that the errors in the DAC currents are averaged together.

DEM can be used for both continuous time and discrete time delta sigma modulators to minimize DAC mismatch. But existing approaches for implementing DEM with a quantizer in a delta sigma modulator will cause a high timing constraint for the DEM and/or quantizer function. For example, both functions of the DEM and the quantizer have to finish within a same half clock cycle for a feedback compensation loop, which again needs higher power to speed up the operations of the DEM and/or the quantizer.

Thus, conventional techniques for ELD compensation with DEM implementation in a continuous time delta sigma modulator are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
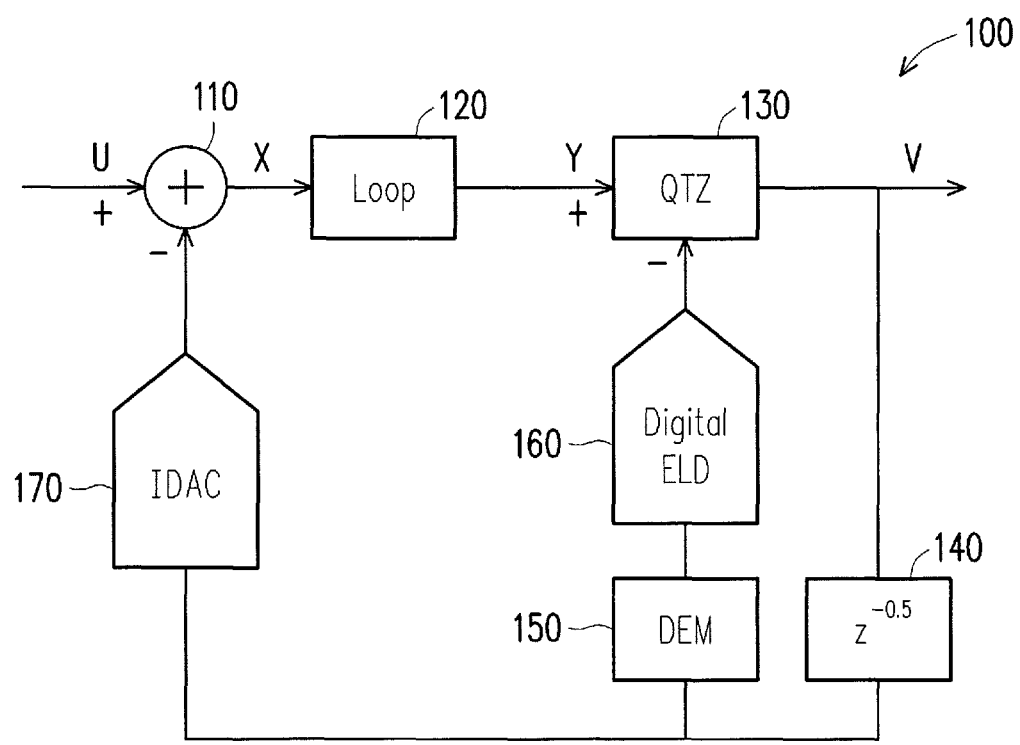
FIG. 1 illustrates an exemplary block diagram of a delta sigma modulator, in accordance with various embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative tell is, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A delta sigma modulator may encode analog signals into digital signals as in an ADC, or encode high-resolution signals into lower resolution signals using pulse-density modulation in a DAC. Continuous time delta sigma modulators generally suffer from ELD. Conventional methods for compensating ELD of a delta sigma modulator need an extra DAC and thus increase power consumption of the delta sigma modulator.

In addition, DACs tend to generate errors correlated to the digital input. These errors are typically the result of component mismatches, process and thermal gradients, and other non-linear error sources. While DEM can be utilized for both continuous time and discrete time delta sigma modulators to minimize DAC mismatch, existing approaches for implementing DEM with a quantizer in a delta sigma modulator cause a high timing constraint for the DEM and/or quantizer function, which again needs higher power to speed up the operations of the DEM and/or the quantizer.

The present disclosure aims at improving loop stability and power efficiency of a delta sigma modulator by novel designs of key blocks (e.g. a digital ELD and a DEM) to reduce power consumption and relax operation timing constraint of the delta sigma modulator. The present disclosure provides various embodiments of a continuous time delta sigma modulator that includes at least: a quantizer, a buffer module, a randomizer, and a reference module. The quantizer includes at least one comparator that generates a digital code based on a comparison of at least one reference potential with an input generated based on a sample of an analog signal. The buffer module stores the digital code for a predetermined delay period and outputs the digital code after the predetermined delay period as a delayed digital code. The randomizer and the reference module operate based on the delayed digital code. For example, the predetermined delay period is a half cycle of a clock signal to give enough time for operations of the quantizer and the randomizer.

In one embodiment, the randomizer may be implemented by a DEM module to randomize the delayed digital code and generate a randomized digital code. The reference module may be implemented by a digital ELD compensator that modifies the reference potential based on the randomized digital code.

In another embodiment, the reference module, implemented by a digital ELD compensator, first modifies at least one reference potential based on the delayed digital code to generate a set of modified reference potentials. Then, the randomizer, implemented by a DEM module, can randomize the set of modified reference potentials.

Compared to a conventional design of a continuous time delta sigma modulator, in some embodiments, the proposed design in the present disclosure changes the ELD compensator from an analog current DAC to a fully digital circuit, which saves power consumption of the continuous time delta sigma modulator. In addition, the ELD compensation structure is implemented together with a DEM module based on the delayed digital code, which provides enough operation time for both the quantizer and the DEM module. This solves the component mismatch problem and avoids the need to speed up the quantization time and DEM acquisition time, and thus further reduces power consumption of the continuous time delta sigma modulator.

The present disclosure is applicable to all kinds of continuous time delta sigma modulators, especially those continuous time delta sigma modulators with higher power and speed requirements, e.g. according to an advanced wireless standard.

FIG. 1 illustrates an exemplary block diagram of a delta sigma modulator 100, in accordance with various embodiments of the present disclosure. As shown in FIG. 1, the delta sigma modulator 100 includes an adder 110, a loop integrator 120, a quantizer 130, a buffer module 140, a DEM module 150, a digital ELD reference module 160, and a DAC 170.

The delta sigma modulator 100 may be a continuous time delta sigma modulator that encodes analog signals into digital signals as in an ADC. In some embodiments, a similar structure as the delta sigma modulator 100 may be implemented to encode high-resolution signals into lower resolution signals using pulse-density modulation in a DAC.

The DAC 170 may be a current DAC (IDAC) that generates an analog output based on the digital outputs of the quantizer 130, e.g., after a half cycle delay at the buffer module 140. In one embodiment, the adder 110 includes a non-inverting input that receives a sample of an analog signal (U) and an inverting input that receives the analog output of the DAC 170. The adder 110 subtracts the analog output of the DAC 170 from the sample of the analog signal. Accordingly, the adder 110 may also be referred to as a subtractor.

The loop integrator 120 is a loop integrator that integrates the output (X) of the adder 110 and provides an integrated output (Y) to the quantizer 130. The analog signal is sampled each predetermined sampling period for digitization by the delta sigma modulator 100. When the conversion process is complete, the digital outputs of the quantizer 130 are a digital representation of the sample of the analog input signal.

The quantizer 130 may include one or more comparators that compare the integrated output (Y) with respective references at each clock period (Ts). The quantizer 130 generates the digital outputs (V) based on the comparisons, respectively. In one embodiment, the clock period (Ts) is shorter than the predetermined sampling period (of the analog input signal) so multiple sets of the digital outputs can be fed back for comparison with each sample of the analog input signal.

The input (Y) to the quantizer 130 is updated based on the analog values output by the DAC 170. The quantizer 130 updates the digital outputs based on the updated input. For example, the input and the digital outputs are updated on multiple occasions (based on a clock signal) between times when the analog signal is sampled. This enables the digital outputs to be adjusted during the conversion process to best represent the sample of the analog signal.

The buffer module 140 buffers the digital outputs of the quantizer 130 for one-half of the clock period (Ts) before outputting the delayed digital outputs. Accordingly, the DAC 170 generates the analog output based on the delayed digital outputs. It can be understood that in some embodiments, the buffer module 140 may be replaced with a buffer that buffers the digital outputs of the quantizer 130 for more or less than one-half of the clock period (Ts).

Continuous time delta sigma modulators generally suffer from ELD, which may correspond to a delay period associated with a DAC, a delay period of the components that provide the input to the quantizer, and a delay period of the quantizer itself. The delay period of the quantizer may correspond to a period between when the quantizer is prompted to update the digital outputs (e.g., based on the clock signal) and when the quantizer actually outputs the updated digital outputs. Relative to the delay period of the quantizer, the delay period of the DAC and the delay period of the components that provide the input to the quantizer may be negligible. The digital ELD reference module 160 in this example can vary the reference voltages supplied to the quantizer 130, to compensate the ELD of the delta sigma modulator 100. The digital ELD reference module 160 may generate modified reference potentials to the quantizer 130 based on the delayed digital outputs from the buffer module 140. Compared to a continuous time delta sigma modulator with a fix reference potential supplied to the quantizer, the delta sigma modulator 100 of FIG. 1 consumes less power.

In this example, the digital ELD reference module 160 is implemented as a fully or highly digital circuit. Compared to a continuous time delta sigma modulator with an extra IDAC other than the DAC 170 for ELD compensation, the delta sigma modulator 100 including the digital ELD compensator 160 in FIG. 1 consumes less power.

In addition, DACs tend to generate errors correlated to the digital input. These errors are typically the result of component mismatches, process and thermal gradients, and other non-linear error sources. These errors may create harmonic distortion that causes undesirable effects to the conversion process. DEM may be used to compensate for components mismatch and improve the average linearity of a DAC. For example, the one's in a given thermometer code are spread around in a random fashion by DEM so that the errors in the DAC currents are averaged together. Theoretically, if the spreading is ideal and enough time is allowed to average the current elements, the DAC becomes perfectly linear. In effect, the energy that is normally concentrated at harmonic frequencies becomes white noise, somewhat raising the noise floor while significantly improving the total harmonic distortion and spurious free dynamic range.

The DEM module 150 in the delta sigma modulator 100 can be implemented as any randomizer that randomizes the delayed digital outputs of the quantizer 130 to minimize DAC mismatch and avoid a noise of a fixed pattern. It can be understood that, after the delayed digital outputs are randomized, the outputs of the digital ELD reference module 160 and the outputs of the quantizer 130 are also randomized accordingly. As such, the inputs to the DAC 170 are also randomized in the next cycle, thus minimizing the DAC mismatch and avoiding a noise of a fixed pattern.

Because the DEM module 150 is disposed in the feedback path of the quantizer 130, a half cycle of a clock signal is reserved for the quantizer 130 to perform quantization. The DEM module 150 is also implemented as a digital circuit which can easily finish the DEM operation within a half cycle. Compared to a conventional design where both functions of the DEM and the quantizer have to finish within a same half clock cycle, the proposed design in FIG. 1 relaxes the power consumption requirement of the delta sigma modulator 100.

In this example, the digital ELD reference module 160 operates after the DEM module 150. That is, the digital ELD reference module 160 generates modified reference potentials based on the shuffled digital code generated by the DEM module 150.

Figure 2:
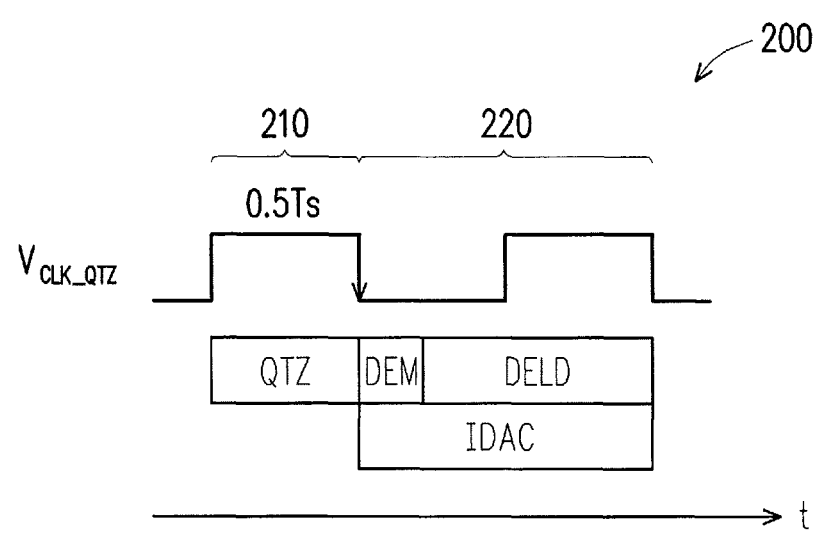
FIG. 2 illustrates an operation sequence diagram of the delta sigma modulator shown in FIG. 1, in accordance with some embodiments of the present disclosure.

FIG. 2 illustrates an operation sequence diagram 200 of the delta sigma modulator 100 shown in FIG. 1, in accordance with some embodiments of the present disclosure. As shown in FIG. 2, the quantizer 130 can operate within a half cycle (0.5 Ts) 210 of the clock signal. In the next cycle 220, the DEM module 150 and the digital ELD reference module 160 operate in series. In this embodiment, the DEM module 150 operates before the digital ELD reference module 160. The DAC 170 operates in the next cycle 220, in parallel to operations of the DEM module 150 and the digital ELD reference module 160. This illustrates that the quantizer 130 can have enough time for quantization. While the DEM module 150 and the digital ELD reference module 160 need to share a same cycle, they operate both on digital signals, which do not need much time. For example, the DEM function of the DEM module 150 can be performed within ¼ of a clock cycle.

Figure 3:
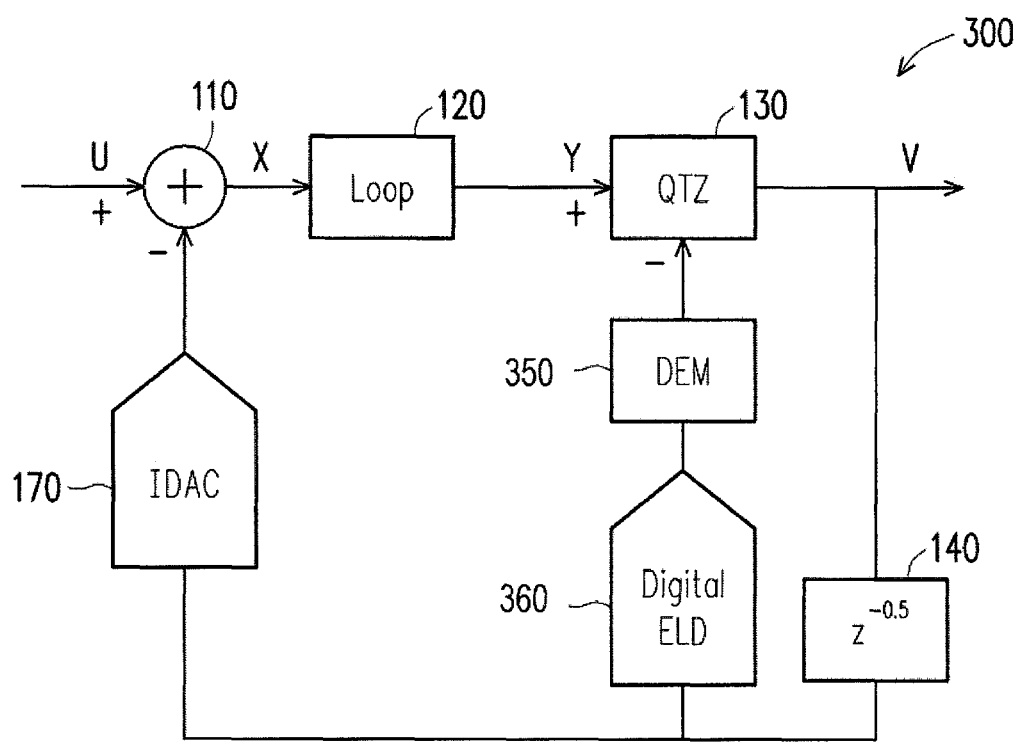
FIG. 3 illustrates an exemplary block diagram of another delta sigma modulator, in accordance with various embodiments of the present disclosure.

FIG. 3 illustrates an exemplary block diagram of another delta sigma modulator 300, in accordance with various embodiments of the present disclosure. As shown in FIG. 3, the delta sigma modulator 100 includes an adder 110, a loop integrator 120, a quantizer 130, a buffer module 140, a DEM module 350, a reference module 360, and a DAC 170.

The delta sigma modulator 300 may be a continuous time delta sigma modulator that encodes analog signals into digital signals as in an ADC. In some embodiments, a similar structure as the delta sigma modulator 300 may be implemented to encode high-resolution signals into lower resolution signals using pulse-density modulation in a DAC.

The adder 110, the loop integrator 120, the quantizer 130, the buffer module 140, and the DAC 170 in the delta sigma modulator 300 work similarly to the adder 110, the loop integrator 120, the quantizer 130, the buffer module 140, and the DAC 170 in the delta sigma modulator 100, respectively.

The reference module 360 in this example can vary the reference voltages supplied to the quantizer 130, to compensate the ELD of the delta sigma modulator 300. Different from the delta sigma modulator 100 in FIG. 1, the reference module 360 in the delta sigma modulator 300 operates before the DEM module 350. That is, the reference module 360 generates modified reference potentials based on the delayed digital outputs from the buffer module 140; and the DEM module 350 shuffles the modified reference potentials before they are used by the quantizer 130.

In this example, the reference module 360 is implemented as a fully or highly digital circuit. As such, compared to a continuous time delta sigma modulator with a fix reference potential supplied to the quantizer or compared to a continuous time delta sigma modulator with an extra IDAC other than the DAC 170 for ELD compensation, the delta sigma modulator 300 of FIG. 3 consumes less power.

Again, because the DEM module 350 is disposed in the feedback path of the quantizer 130, a half cycle of a clock signal is reserved for the quantizer 130 to perform quantization. The DEM module 350 is also implemented as a digital circuit which can easily finish the DEM operation within a half clock cycle. Compared to a conventional design where both functions of the DEM and the quantizer have to finish within a same half clock cycle, the proposed design in FIG. 3 relaxes the power consumption requirement of the delta sigma modulator 300.

Figure 4:
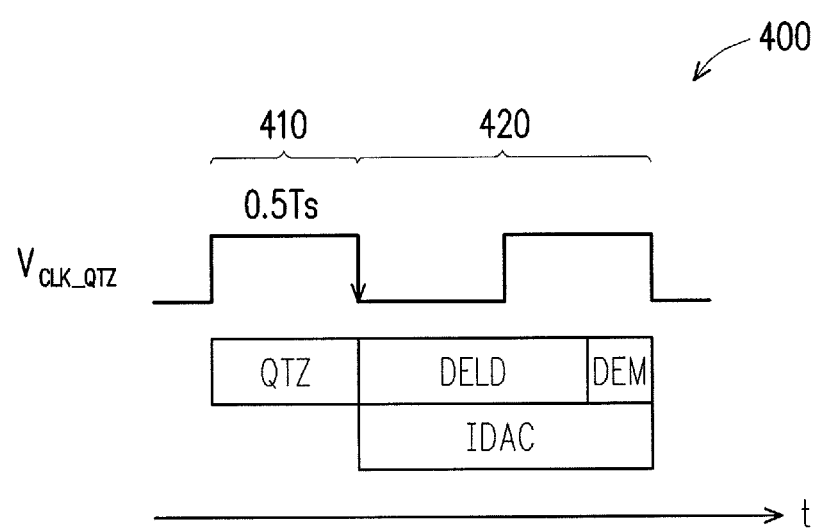
FIG. 4 illustrates an operation sequence diagram of the delta sigma modulator shown in FIG. 3, in accordance with some embodiments of the present disclosure.

FIG. 4 illustrates an operation sequence diagram 400 of the delta sigma modulator 300 shown in FIG. 3, in accordance with some embodiments of the present disclosure. As shown in FIG. 4, the quantizer 130 can operate within a half cycle (0.5 Ts) 410 of the clock signal. In the next cycle 420, the reference module 360 and the DEM module 350 operate in series. In this embodiment, the reference module 360 operates before the DEM module 350. The DAC 170 operates in the next cycle 420, in parallel to operations of the DEM module 350 and the reference module 360. This illustrates that the quantizer 130 can have enough time for quantization. While the DEM module 350 and the reference module 360 need to share a same cycle, they operate both on digital signals, which do not need much time. For example, the DEM function of the DEM module 350 can be performed within ¼ of a clock cycle.

It can be understood that, in one embodiment, there are two DEM modules in a delta sigma modulator, where the digital ELD block is disposed between the two DEM modules.

It can also be understood that, in one embodiment, the DEM module and the digital ELD block in the delta sigma modulator form a loop to generate randomized and updated reference potentials.

Figure 5:
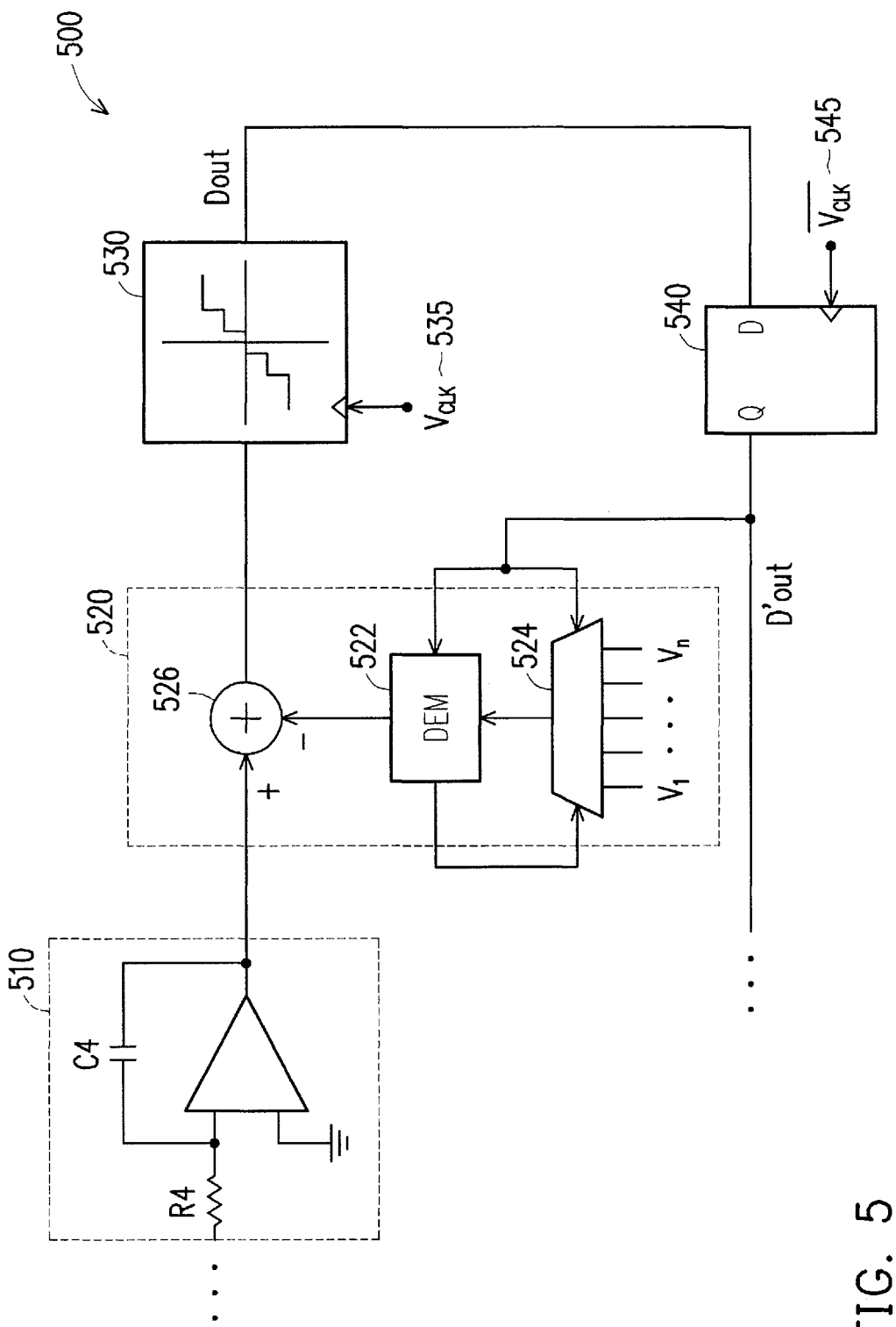
FIG. 5 illustrates a detailed block diagram of a portion of a delta sigma modulator, in accordance with various embodiments of the present disclosure.

FIG. 5 illustrates a detailed block diagram of a portion of a delta sigma modulator 500, in accordance with various embodiments of the present disclosure. As shown in FIG. 5, the delta sigma modulator 500 includes an integrator 510, a digital circuit 520, a quantizer 530, and a buffer module 540.

As shown in FIG. 5, the integrator 510 may be implemented with a standard integrator circuit that includes a resistor, a capacitor, and an amplifier. The integrator 510 generates an integrated analog signal and sends it to the digital circuit 520. The digital circuit 520 may be a digital circuit 520 that integrates functions of a DEM module 522, a digital ELD compensator 524, and an adder 526, in accordance with some embodiments.

The digital ELD compensator 524 may include a multiplexer that selects one of several digital input signals ($V_1, \ldots, V_n$) and forwards the selected input into the DEM module 522. In accordance with various embodiments, the digital ELD compensator 524 may include multiple multiplexers. In one embodiment, the quantizer 530 is a 2-bit quantizer that quantizes an analog signal using a 2-bit resolution with 4 levels of quantization. The digital ELD compensator 524 then includes 4 multiplexers to select 4 inputs and forward them into the DEM module 522 as selected reference potentials. The selected reference potentials may be different from the original reference potentials in previous round. That is, one or more of the reference potentials may be modified in each cycle.

The DEM module 522 can shuffle the selected reference potentials received from the digital ELD compensator 524 and output the randomized reference potentials to the adder 526. In one embodiment, the shuffled result of 522 can be fed back to the digital ELD compensator 524 for selecting the reference potentials iteratively. The adder 526 receives the integrated analog signal from the integrator 510 and subtracts it with the randomized reference potentials before sending it as an analog input to the quantizer 530 for quantization.

The quantizer 530 receives the analog input and quantizes it to generate a digital output $D_{out}$. In this example, the quantizer 530 operates at a positive cycle ($V_{CLK}$) 535 of a clock signal. The quantizer 530 sends the digital output into the buffer module 540, which buffers the $D_{out}$ and outputs a delayed digital output $D'_{out}$ at a negative cycle ($\overline{V}_{CLK}$) 545 of the clock signal. That is, the buffer module 540 delays the digital output of the quantizer 530 for half cycle and sends the delayed digital output into the digital circuit 520 for ELD compensation and DEM.

Figure 6:
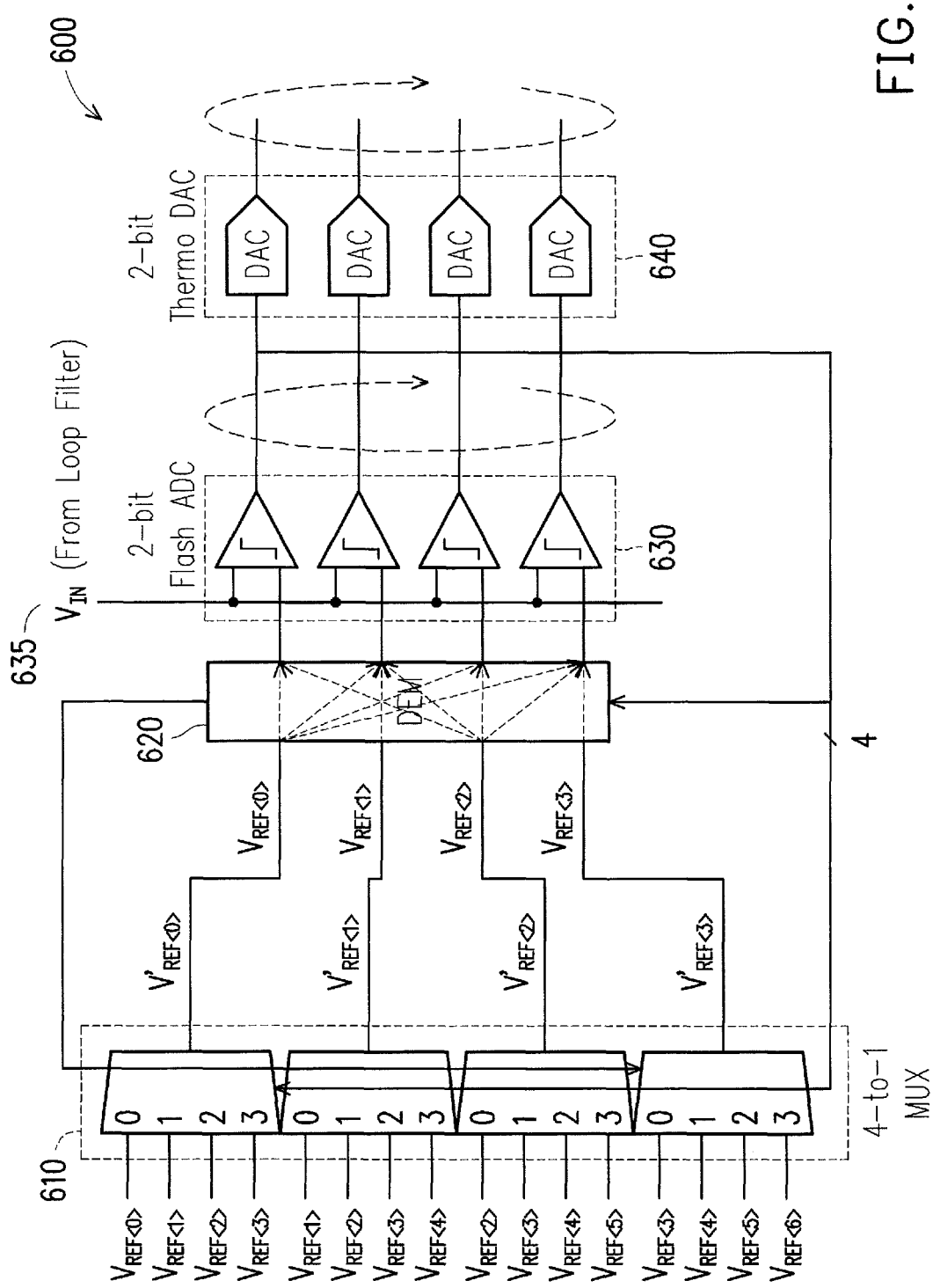
FIG. 6 illustrates a detailed block diagram of a portion of a delta sigma modulator including a 2-bit sub-ADC (analog to digital converter), in accordance with various embodiments of the present disclosure.

FIG. 6 illustrates a detailed block diagram of a portion of a delta sigma modulator 600 including a 2-bit sub-ADC, in accordance with various embodiments of the present disclosure. As shown in FIG. 6, the delta sigma modulator 600 includes fours 4-to-1 multiplexers 610, a DEM module 620, a 2-bit ADC 630, and a 2-bit DAC 640.

Each of the four multiplexers 610 selects one of four reference potentials and forwards it to the DEM module 620. The DEM module 620 randomizes the four selected reference potentials from the four multiplexers 610. The DEM module 620 can feedback the randomized reference potentials to the four multiplexers 610 for further selection and randomization. The DEM module 620 can also send the randomized reference potentials to the 2-bit ADC 630 for quantization of an analog input signal $V_{IN}$ 635 that comes from a loop filter, e.g. an integrator.

The 2-bit ADC 630 in this example is a 2-bit flash ADC that uses a linear voltage ladder with a comparator at each of the four rungs of the ladder to compare the input voltage $V_{IN}$ 635 to successive four reference voltages received from the DEM module 620. After the comparisons, the 2-bit ADC 630 generates a 2-bit digital code as a digital output. The 2-bit ADC 630 may send the 2-bit digital code back to the four multiplexers 610 for updating the reference potentials. The 2-bit ADC 630 may also send the 2-bit digital code to the 2-bit DAC 640 for digital to analog conversion.

The 2-bit DAC 640 in this example is a 2-bit thermos DAC that contains an equal resistor or current-source segment for each possible value of DAC output. There are 4 segments in the 2-bit DAC 640. Since the order of the reference potentials are shuffled at the DEM module 620, the noise levels for the four digital outputs of the 2-bit ADC 630 are also shuffled accordingly. In turn, the noise or distortion levels of the four analog outputs of the 2-bit DAC 640 are also shuffled accordingly to avoid a fixed-pattern noise or DAC mismatch.

Figure 7:
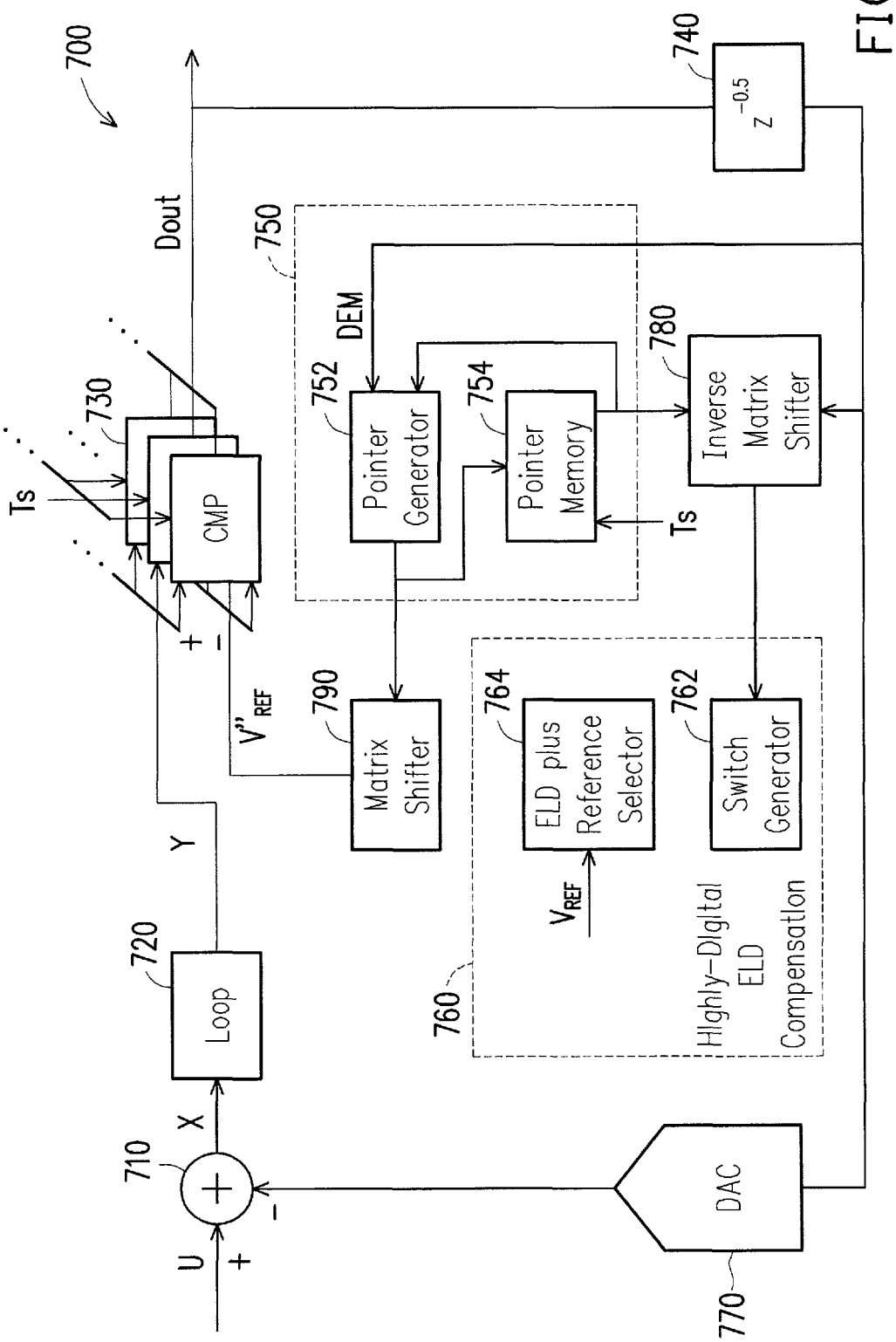
FIG. 7 illustrates a detailed block diagram of another delta sigma modulator, in accordance with various embodiments of the present disclosure.

FIG. 7 illustrates a detailed block diagram of another delta sigma modulator 700, in accordance with various embodiments of the present disclosure. As shown in FIG. 7, the delta sigma modulator 700 includes an adder 710, an integrator 720, a quantizer 730, a buffer module 740, a DEM module 750, a reference module 760, a DAC 770, an inverse matrix shifter 780, and a matrix shifter 790.

The delta sigma modulator 700 may be a continuous time delta sigma modulator that encodes analog signals into digital signals as in an ADC. In some embodiments, a similar structure as the delta sigma modulator 700 may be implemented to encode high-resolution signals into lower resolution signals using pulse-density modulation in a DAC.

The adder 710, the integrator 720, the buffer module 740, and the DAC 770 in the delta sigma modulator 700 work similarly to the adder 110, the loop integrator 120, the buffer module 140, and the DAC 170 in the delta sigma modulator 100, respectively.

The quantizer 730 in this example includes a plurality of comparators that compare the integrated output (Y) received from the integrator 720 with respective references $V''_{REF}$ at each clock period (Ts). The quantizer 730 generates a digital code ($D_{out}$) based on the comparisons, respectively. The input (Y) to the quantizer 730 is updated based on the analog values output by the DAC 770. The quantizer 730 updates the digital code ($D_{out}$) based on the updated input.

The buffer module 740 buffers the digital code of the quantizer 730 for one-half of the clock period (Ts) before outputting the delayed digital code. Accordingly, the DAC 770 generates the analog output based on the delayed digital code. It can be understood that in some embodiments, the buffer module 740 may be replaced with a buffer that buffers the digital code of the quantizer 730 for more or less than one-half of the clock period (Ts).

The delayed digital code is output by the buffer module 740 into the DEM module 750 for randomizing the delayed digital code to minimize DAC mismatch and avoid a noise of a fixed pattern. It can be understood that, after the delayed digital code are randomized, the outputs of the quantizer 730 are also randomized accordingly. As such, the inputs to the DAC 770 are also randomized in the next cycle, thus minimizing the DAC mismatch and avoiding a noise of a fixed pattern.

In this example, the DEM module 750 includes a pointer generator 752 and a pointer memory 754. The pointer generator 752 can generate random initial points, while the pointer memory 754 can store the moving path of each point. The pointer generator 752 and the pointer memory 754 can cooperate to generate a random order of the inputs and/or outputs of the reference module 760.

Because the DEM module 750 is disposed in the feedback path of the quantizer 730, a half cycle of a clock signal is reserved for the quantizer 730 to perform quantization. The DEM module 750 is implemented as a digital circuit which can easily finish the DEM operation within a half cycle, which saves the power consumption of the delta sigma modulator 700.

The delayed digital code may also be output by the buffer module 740 into the reference module 760 for modifying the reference voltages supplied to the quantizer 730, to compensate the ELD of the delta sigma modulator 700. The reference module 760 may generate modified reference potentials to the quantizer 730 based on the delayed digital code and the random order generated by the DEM module 750.

The reference module 760 in this example includes a switch generator 762 and an ELD plus reference selector 764. The switch generator 762 can generate a switch value based on the delayed or randomized digital code. The ELD plus reference selector 764 can generate a modified reference potential based on the switch value and an input reference $V_{REF}$.

For a multi-bit quantizer 730, the operations of the DEM module 750 and the reference module 760 are on matrix level. Accordingly, the inverse matrix shifter 780 and the matrix shifter 790 can shift the components of a row vector in a matrix one or more positions to the right or to the left, according to the random order generated by the DEM module 750, thereby applying the randomization generated by the DEM module 750 onto reference potentials of the reference module 760.

In this example, the reference module 760 is implemented as a fully or highly digital circuit. As such, compared to a continuous time delta sigma modulator with a fix reference potential supplied to the quantizer or compared to a continuous time delta sigma modulator with an extra IDAC other than the DAC 770 for ELD compensation, the delta sigma modulator 700 of FIG. 7 consumes less power.

Figure 8:
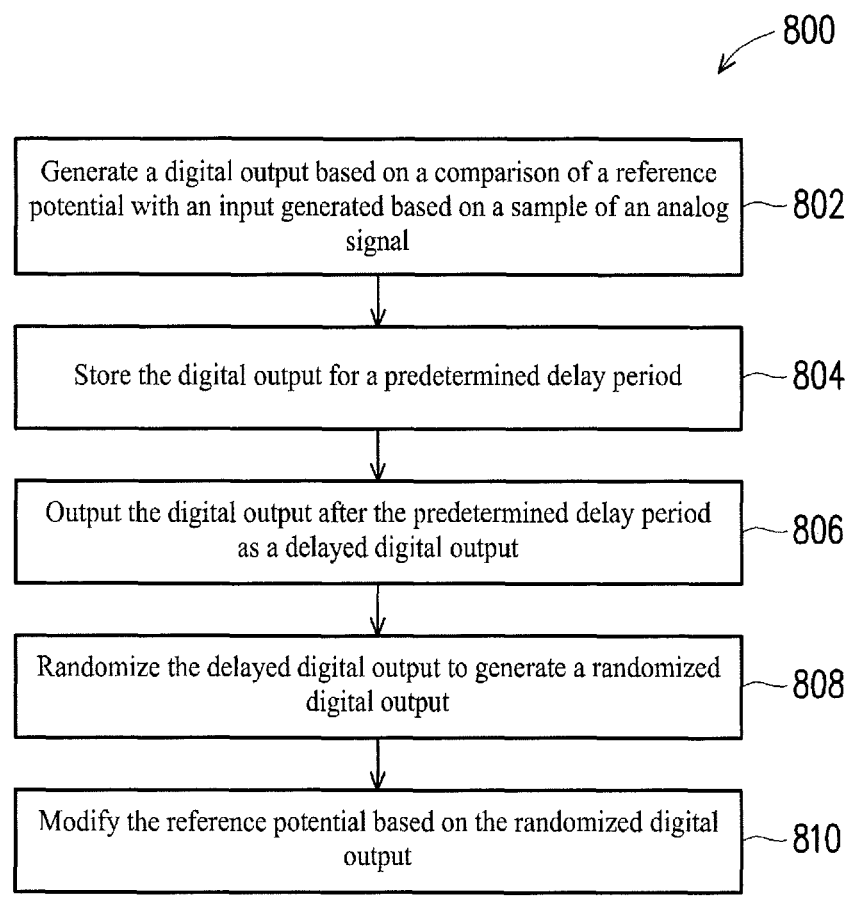
FIG. 8 is a flow chart illustrating an exemplary method for compensating ELD (excess loop delay) in a continuous time delta sigma modulator, in accordance with some embodiments of the present disclosure.

FIG. 8 is a flow chart illustrating an exemplary method 800 for compensating ELD in a continuous time delta sigma modulator, in accordance with some embodiments of the present disclosure. As shown in FIG. 8, a digital output is generated at operation 802 based on a comparison of a reference potential with an input generated based on a sample of an analog signal. The digital output is stored at operation 804 for a predetermined delay period. The digital output is output at operation 806 as a delayed digital output after the predetermined delay period. At operation 808, the delayed digital output is randomized to generate a randomized digital output. The reference potential is modified at operation 810 based on the randomized digital output.

Figure 9:
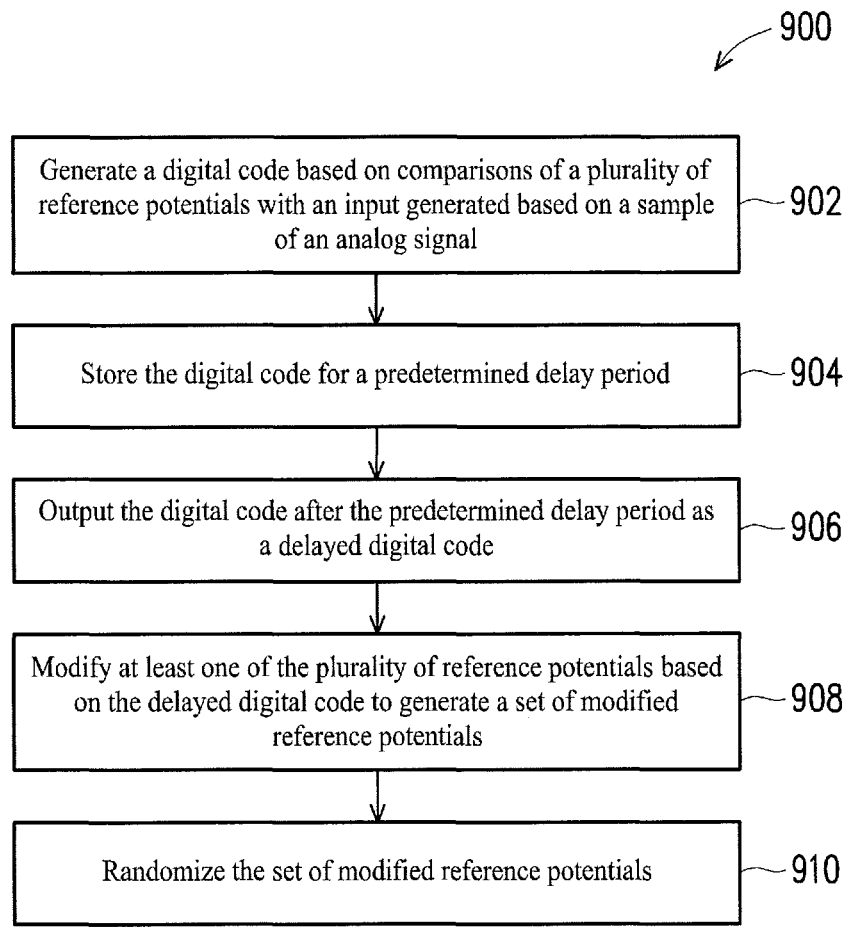
FIG. 9 is a flow chart illustrating another exemplary method for compensating ELD in a continuous time delta sigma modulator, in accordance with some embodiments of the present disclosure.

FIG. 9 is a flow chart illustrating another exemplary method 900 for compensating ELD in a continuous time delta sigma modulator, in accordance with some embodiments of the present disclosure. As shown in FIG. 9, a digital code is generated at operation 902 based on comparisons of a plurality of reference potentials with an input generated based on a sample of an analog signal. The digital code is stored at operation 904 for a predetermined delay period. The digital code is output at operation 906 as a delayed digital code after the predetermined delay period. At operation 908, at least one of the reference potentials is modified based on the delayed digital code to generate a set of modified reference potentials. The set of modified reference potentials is randomized at operation 910.

It can be understood that the order of the steps shown in each of FIG. 8 and FIG. 9 may be changed according to different embodiments of the present disclosure.

In an embodiment, a continuous time delta sigma modulator is disclosed. The continuous time delta sigma modulator includes: a quantizer, a buffer module, a randomizer, and a reference module. The quantizer includes a comparator that generates a digital output based on a comparison of a reference potential with an input generated based on a sample of an analog signal. The buffer module stores the digital output for a predetermined delay period and outputs the digital output after the predetermined delay period as a delayed digital output. The randomizer randomizes the delayed digital output to generate a randomized digital output. The reference module modifies the reference potential based on the randomized digital output.

In another embodiment, a continuous time delta sigma modulator is disclosed. The continuous time delta sigma modulator includes: a quantizer, a buffer module, a randomizer, and a reference module. The quantizer includes a plurality of comparators that generate a digital code based on comparisons of a plurality of reference potentials respectively with an input generated based on a sample of an analog signal. The buffer module stores the digital code for a predetermined delay period and outputs the digital code after the predetermined delay period as a delayed digital code. The reference module modifies at least one of the plurality of reference potentials based on the delayed digital code to generate a set of modified reference potentials. The randomizer randomizes the set of modified reference potentials.

In yet another embodiment, a method implemented on a continuous time delta sigma modulator is disclosed. The method includes: generating a digital output based on a comparison of a reference potential with an input generated based on a sample of an analog signal; storing the digital output for a predetermined delay period; outputting the digital output after the predetermined delay period as a delayed digital output; randomizing the delayed digital output to generate a randomized digital output; and modifying the reference potential based on the randomized digital output.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A continuous time delta sigma modulator, comprising:
a quantizer including a comparator configured to generate a digital output based on a comparison of a reference potential with an input generated based on a sample of an analog signal;
a buffer module configured to store the digital output for a predetermined delay period and output the digital output after the predetermined delay period as a delayed digital output;
a randomizer configured to randomize the delayed digital output to generate a randomized digital output; and
a reference module configured to modify the reference potential based on the randomized digital output.

2. The continuous time delta sigma modulator of claim 1, wherein the reference module comprises:
a switch generator configured to generate a switch value based on the randomized digital output; and
a reference selector configured to generate a modified reference potential based on the switch value.

3. The continuous time delta sigma modulator of claim 1, further comprising:
a digital to analog converter (DAC) configured to convert the delayed digital output into an analog value; and
an integrator configured to generate the input based on the sample of the analog signal and the analog value.

4. The continuous time delta sigma modulator of claim 3, further comprising:
a subtractor configured to subtract the analog value from the sample of the analog signal to produce an output, wherein the integrator generates the input based on a mathematical integral of the output of the subtractor.

5. The continuous time delta sigma modulator of claim 1, wherein the comparator is further configured to update the digital output in each cycle of a clock signal based on the modified reference potential.

6. The continuous time delta sigma modulator of claim 5, wherein the predetermined delay period is a half cycle of the clock signal.

7. The continuous time delta sigma modulator of claim 5, wherein:
the quantizer further includes N additional comparators that are configured to update N additional digital outputs in each cycle of the clock signal based on comparisons of N additional reference potentials, respectively, with the input generated based on the sample of the analog signal;
N is an integer greater than zero;
the buffer module is further configured to store the N digital additional outputs for the predetermined delay period and output the N digital output after the predetermined delay period as N additional delayed digital outputs, respectively; and
the randomizer is further configured to randomize the N additional delayed digital output to generate N additional randomized digital outputs; and
the reference module is further configured to modify at least one of the N additional reference potentials based on the N additional randomized digital outputs.

8. A continuous time delta sigma modulator, comprising:
a quantizer including a plurality of comparators configured to generate a digital code based on comparisons of a plurality of reference potentials respectively with an input generated based on a sample of an analog signal;
a buffer module configured to store the digital code for a predetermined delay period and output the digital code after the predetermined delay period as a delayed digital code;
a reference module configured to modify at least one of the plurality of reference potentials based on the delayed digital code to generate a set of modified reference potentials; and
a randomizer configured to randomize the set of modified reference potentials.

9. The continuous time delta sigma modulator of claim 8, wherein the reference module comprises:
a switch generator configured to generate a switch value based on the delayed digital code; and
a reference selector configured to generate the set of modified reference potentials based on the switch value.

10. The continuous time delta sigma modulator of claim 8, further comprising:
a DAC configured to convert the delayed digital code into an analog value; and
an integrator configured to generate the input based on the sample of the analog signal and the analog value.

11. The continuous time delta sigma modulator of claim 10, further comprising:
a subtractor configured to subtract the analog value from the sample of the analog signal to produce an output, wherein the integrator generates the input based on a mathematical integral of the output of the subtractor.

12. The continuous time delta sigma modulator of claim 8, wherein at least one of the plurality of comparators updates the digital code in each cycle of a clock signal based on the set of modified reference potentials.

13. The continuous time delta sigma modulator of claim 12, wherein the predetermined delay period is a half cycle of the clock signal.

14. A method, comprising:
generating a digital output based on a comparison of a reference potential with an input generated based on a sample of an analog signal;
storing the digital output for a predetermined delay period;
outputting the digital output after the predetermined delay period as a delayed digital output;
randomizing the delayed digital output to generate a randomized digital output; and
modifying the reference potential based on the randomized digital output.

15. The method of claim 14, wherein modifying the reference potential comprises:
generating a switch value based on the randomized digital output; and
generating a modified reference potential based on the switch value.

16. The method of claim 14, further comprising:
converting the delayed digital output into an analog value; and
generating the input based on the sample of the analog signal and the analog value.

17. The method of claim 16, further comprising:
subtracting the analog value from the sample of the analog signal to produce an output, wherein the input is generated based on a mathematical integral of the produced output.

18. The method of claim 14, further comprising:
updating the digital output in each cycle of a clock signal based on the modified reference potential.

19. The method of claim 18, wherein the predetermined delay period is a half cycle of the clock signal.

20. The method of claim 18, further comprising:
updating N additional digital outputs in each cycle of the clock signal based on comparisons of N additional reference potentials, respectively, with the input generated based on the sample of the analog signal, wherein N is an integer greater than zero;
storing the N digital additional outputs for the predetermined delay period;
outputting the N digital output after the predetermined delay period as N additional delayed digital outputs, respectively;
randomizing the N additional delayed digital output to generate N additional randomized digital outputs;
modifying at least one of the N additional reference potentials based on the N additional randomized digital outputs to generate a set of modified reference potentials; and
randomizing the set of modified reference potentials.

* * * * *